(12) United States Patent
Booth, Jr. et al.

(10) Patent No.: US 8,921,198 B2
(45) Date of Patent: Dec. 30, 2014

(54) METHOD AND STRUCTURE FOR FORMING A DEEP TRENCH CAPACITOR

(75) Inventors: Roger A. Booth, Jr., Irvine, CA (US); Kangguo Cheng, Guilderland, NY (US); Robert Hannon, Wappingers Falls, NY (US); Ravi M. Todi, Poughkeepsie, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 13/428,303

(22) Filed: Mar. 23, 2012

(65) Prior Publication Data

US 2012/0181661 A1    Jul. 19, 2012

Related U.S. Application Data

(62) Division of application No. 12/370,024, filed on Feb. 12, 2009, now abandoned.

(51) Int. Cl.
| | |
|---|---|
| *H01L 29/02* | (2006.01) |
| *H01L 29/66* | (2006.01) |
| *H01L 29/94* | (2006.01) |
| *H01L 27/07* | (2006.01) |
| *H01L 27/12* | (2006.01) |
| *H01L 49/02* | (2006.01) |
| *H01L 27/06* | (2006.01) |

(52) U.S. Cl.
CPC ............ *H01L 29/945* (2013.01); *H01L 27/1203* (2013.01); *H01L 29/66181* (2013.01); *H01L 28/90* (2013.01); *H01L 27/0605* (2013.01); *H01L 27/0733* (2013.01)
USPC ............. 438/381; 257/532; 257/E21.008

(58) Field of Classification Search
CPC ............ H01L 29/66181; H01L 27/1087; H01L 29/945; H01L 27/1203; H01L 27/10861; H01L 21/84; H01L 27/10829; H01L 27/10823; H01L 28/40; H01L 21/76232; H01L 21/76898; H01L 27/0805; H01L 27/10832
USPC ............. 257/532, E21.008, E29.002, 301, 257/E21.396, E21.651, E29.346, E27.092, 257/296, E27.112, 300, 303, 306, E21.549, 257/E27.016, E27.091, E27.095, E29.343, 257/71; 438/381, 455, 243, 253, 238
See application file for complete search history.

(56) References Cited

U.S. PATENT DOCUMENTS

| | | |
|---|---|---|
| 5,262,590 A | 11/1993 | Lia |
| 5,369,219 A | 11/1994 | Kerns |

(Continued)

FOREIGN PATENT DOCUMENTS

WO    2008/101738 A1    8/2008

OTHER PUBLICATIONS

PCT/EP2010/050627 Notification of Transmittal of the International Search Report and The Written Opinion Mailed Jun. 4, 2010.

(Continued)

*Primary Examiner* — Stephen W Smoot
*Assistant Examiner* — Edward Chin
(74) *Attorney, Agent, or Firm* — Matthew C. Zehrer (57) ABSTRACT

A method of forming a deep trench capacitor includes providing a wafer. Devices are formed on a front side of the wafer. A through-silicon-via is formed on a substrate of the wafer. Deep trenches are formed on a back side of the wafer. A deep trench capacitor is formed in the deep trench. The through-silicon-via connects the deep trench capacitor to the devices.

13 Claims, 9 Drawing Sheets

(56) References Cited

U.S. PATENT DOCUMENTS

| | | | |
|---|---|---|---|
| 5,480,841 A | 1/1996 | Bickford et al. |
| 5,640,699 A | 6/1997 | Ralph |
| 5,656,510 A | 8/1997 | Chrapacz et al. |
| 5,719,749 A | 2/1998 | Stopperan |
| 5,759,907 A | 6/1998 | Assaderaghi et al. |
| 6,111,756 A | 8/2000 | Moresco |
| 6,205,654 B1 | 3/2001 | Burns |
| 6,380,028 B1 | 4/2002 | Kim |
| 6,395,480 B1 | 5/2002 | Hefti |
| 6,423,596 B1 | 7/2002 | McKee |
| 6,555,745 B1 | 4/2003 | Kruse et al. |
| 6,635,525 B1 | 10/2003 | Mandelman et al. |
| 6,788,073 B2 | 9/2004 | Wallace et al. |
| 6,800,169 B2 | 10/2004 | Liu et al. |
| 6,815,749 B1 | 11/2004 | Mandelman et al. |
| 6,847,853 B1 | 1/2005 | Vinciarelli et al. |
| 7,192,752 B2 | 3/2007 | Xu et al. |
| 7,236,060 B2 | 6/2007 | Wood |
| 7,239,013 B2 | 7/2007 | Shimada et al. |
| 7,249,337 B2 | 7/2007 | Gisin et al. |
| 7,276,986 B2 | 10/2007 | Barr et al. |
| 7,439,449 B1 | 10/2008 | Kumar et al. |
| 7,524,194 B2 | 4/2009 | Eldridge et al. |
| 7,531,751 B2 | 5/2009 | Hosomi et al. |
| 7,589,283 B2 | 9/2009 | Danoski et al. |
| 7,592,250 B2 | 9/2009 | Shimada et al. |
| 7,626,216 B2 | 12/2009 | McKinzie |
| 7,678,585 B2 | 3/2010 | Zimmer |
| 7,696,442 B2 | 4/2010 | Muramatsu et al. |
| 7,703,201 B2 | 4/2010 | Oggioni et al. |
| 2003/0188890 A1 | 10/2003 | Bhatt et al. |
| 2004/0195621 A1* | 10/2004 | Nasr ............ 257/347 |
| 2006/0121446 A1 | 6/2006 | Abassi et al. |
| 2006/0234405 A1 | 10/2006 | Best |
| 2006/0275981 A1* | 12/2006 | Avellan et al. ............ 438/253 |
| 2007/0039171 A1 | 2/2007 | Goergen |
| 2007/0066126 A1 | 3/2007 | Dutta et al. |
| 2008/0034335 A1 | 2/2008 | Cheng et al. |
| 2008/0179678 A1 | 7/2008 | Dyer et al. |
| 2008/0260985 A1 | 10/2008 | Shirai et al. |
| 2008/0284037 A1* | 11/2008 | Andry et al. ............ 257/774 |
| 2008/0315356 A1 | 12/2008 | Reisner |
| 2009/0032285 A1 | 2/2009 | Ueda et al. |
| 2009/0107710 A1 | 4/2009 | Goergen |
| 2009/0158581 A1 | 6/2009 | Nguyen et al. |
| 2009/0223710 A1 | 9/2009 | Becker et al. |
| 2009/0255713 A1 | 10/2009 | Dangler et al. |
| 2009/0258194 A1 | 10/2009 | Dangler et al. |
| 2009/0290476 A1 | 11/2009 | Okada |
| 2010/0178761 A1* | 7/2010 | Chen et al. ............ 438/613 |
| 2010/0180437 A1 | 7/2010 | McKinzie, III |
| 2012/0181661 A1* | 7/2012 | Booth et al. ............ 257/532 |

OTHER PUBLICATIONS

Goto et al., "Electrical Design Optimization and Characterization in Cell Broadband Engine Package," Publication Year 2006, Electronic Components and Technology Conference 2006, Proceedings, 56th.

Swirbel et al., "Electrical Design and Simulation of High Density Printed Circuit Boards," Publication Year 1999, Advanced Packaging, IEEE Transactions, vol. 22, Issue 3, pp. 416-423.

* cited by examiner

METHOD AND STRUCTURE FOR FORMING A DEEP TRENCH CAPACITOR

CROSS-REFERENCE TO RELATED APPLICATION

This application is a divisional of currently co-pending U.S. patent application Ser. No. 12/370,024, filed on Feb. 12, 2009, the subject matter of which is incorporated herein by reference in its entirety.

BACKGROUND OF THE INVENTION

The present invention relates generally to a method for forming a capacitor and, more specifically, to a method for forming a deep trench capacitor.

Advancement in chip technology means logic switching and data transfer rates continually increase. This makes power supply decoupling more critical for system performance, yet has the effect of making the problem of power supply decoupling more difficult. Current on-chip decoupling capacitors invariably consume silicon real estate, which can temper area reductions from CMOS scaling. Even back-end-of-the-line (BEOL) capacitors often have requirements on what is placed underneath them. BEOL capacitors can consume wiring channels above or below the capacitor. Conventional deep trench capacitors offer good capacitance density, but consume silicon area. BEOL capacitors typically have low capacitance density compared to front-end-of-the-line (FEOL) capacitors, which benefit from comparatively thinner dielectrics. Therefore, a continuing need exists for technologies which can reduce area consumed by decoupling capacitors.

SUMMARY OF THE INVENTION

In a first aspect of the invention, a method of forming a deep trench capacitor includes providing a first wafer, the first wafer having a front side and a back side and including a substrate. The method includes forming devices on the front side of the first wafer. The method includes forming a through-silicon-via on the substrate. The method further includes forming a deep trench on the back side of the first wafer. The method also includes forming a deep trench capacitor in the deep trench, wherein the through-silicon-via connects the deep trench capacitor to the devices.

In a further aspect of the invention, a method of forming a deep trench capacitor includes providing a first wafer, the first wafer having a front side and a back side and including a substrate. The method includes forming devices on the front side of the first wafer. The method includes forming a through-silicon-via on the substrate. The method includes thinning silicon from the back side of the first wafer to expose the through-silicon-via. The method includes depositing a pad layer on the substrate. The method includes forming a deep trench on the back side of the first wafer. The method includes forming a buried plate in the substrate, wherein the buried plate contacts the through-silicon-via. The method includes performing an anneal. The method includes depositing a node dielectric layer in the deep trench. The method further includes filling the deep trench with a conductive material. The method also includes depositing a conductive layer over the pad layer and the conductive material.

In a further aspect of the invention, a method of forming a deep trench capacitor includes providing a first wafer and a second wafer. The method includes bonding the first wafer to the second wafer. The method includes fabricating a through-silicon-via in the first and second wafers. The method includes metalizing the through-silicon-via. The method includes forming a recess above the through-silicon-via. The method includes filling the recess with a non-conductive material. The method includes forming a deep trench in a substrate on the second wafer. The method further includes forming a buried plate in the substrate, wherein the through-silicon-via contacts the buried plate and wiring on the first wafer. The method also includes filling the deep trench with a conductive material.

In a yet further aspect of the invention, a deep trench capacitor includes a wafer. The deep trench capacitor includes devices formed on a front side of the wafer. The deep trench capacitor includes a through-silicon-via formed on a substrate of the wafer. The deep trench capacitor further includes a deep trench formed on a back side of the wafer. The deep trench capacitor also includes a deep trench capacitor formed in the deep trench, wherein the through-silicon-via connects the deep trench capacitor to the devices.

In another aspect of the invention, a deep trench capacitor includes a substrate. The deep trench capacitor includes a through-silicon-via formed on the substrate. The deep trench capacitor includes a pad layer deposited on the substrate. The deep trench capacitor includes a deep trench formed in the substrate. The deep trench capacitor includes a buried plate formed in the substrate, wherein the buried plate is electrically connected to the through-silicon-via. The deep trench capacitor includes a node dielectric layer deposited in the deep trench. The deep trench capacitor further includes a conductive material filling the deep trench. The deep trench capacitor also includes a conductive layer deposited over the pad layer and the conductive material.

In another aspect of the invention, a deep trench capacitor includes a first wafer bonded to a second wafer. The deep trench capacitor includes a through-silicon-via fabricated in the first and second wafers, wherein the through-silicon-via is metalized. The deep trench capacitor includes a deep trench formed in a substrate of the second wafer. The deep trench capacitor includes a buried plate formed in the substrate, wherein the through-silicon-via contacts the buried plate and wiring on the first wafer. The deep trench capacitor further includes a recess above the through-silicon-via, wherein the recess is filled with a non-conductive material. The deep trench capacitor also includes a conductive material filling the deep trench.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

Figure 1:
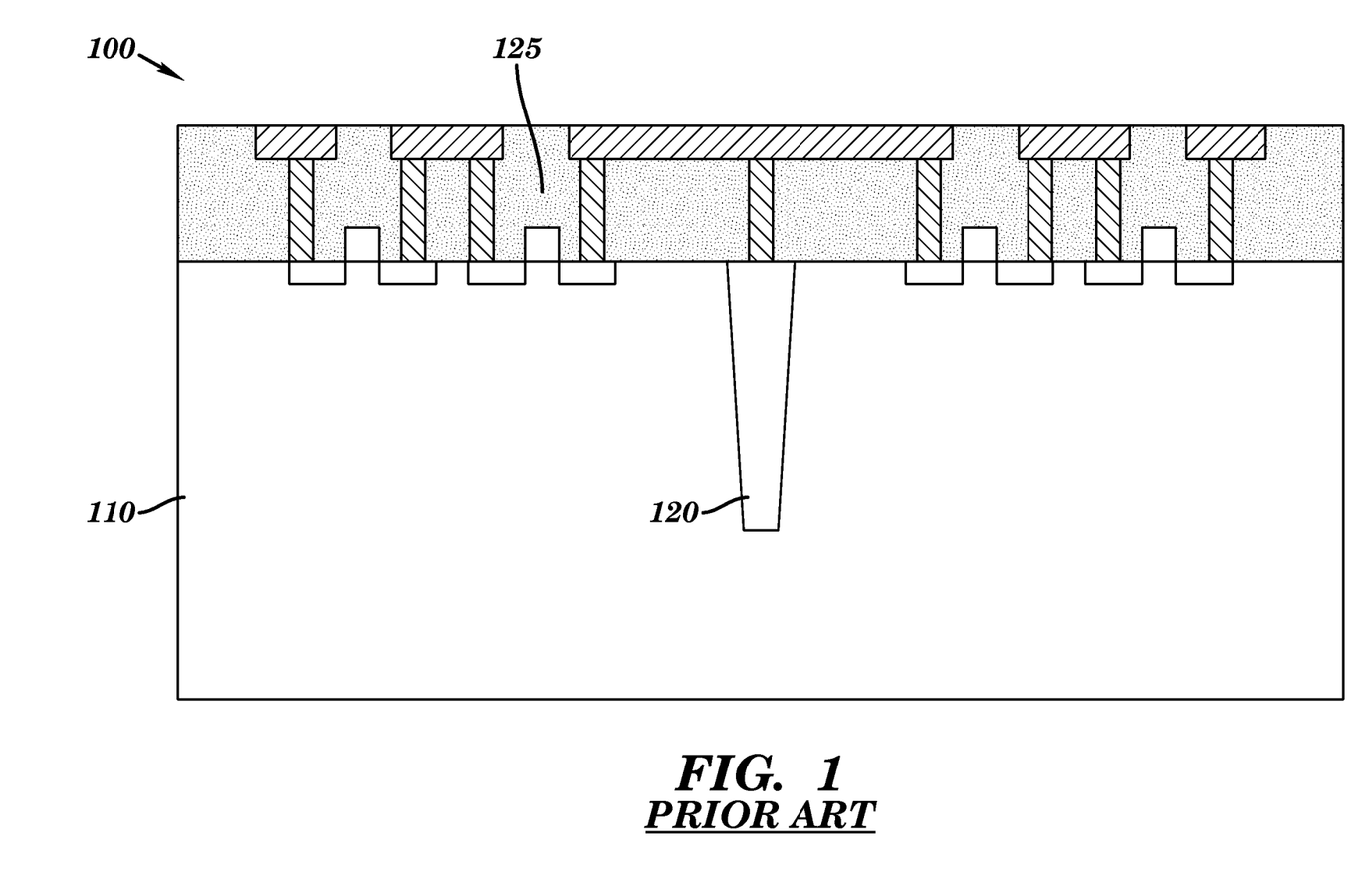
FIGS. 1-3 show a starting structure and prior art processing steps.

Referring to FIG. 1, standard processes are used to form devices 125 and a through-silicon-via 120 on a substrate 110 of a wafer 100. Substrate 110 may be silicon, silicon-on-insulator, gallium arsenide or other substrate known in the art.

Figure 2:
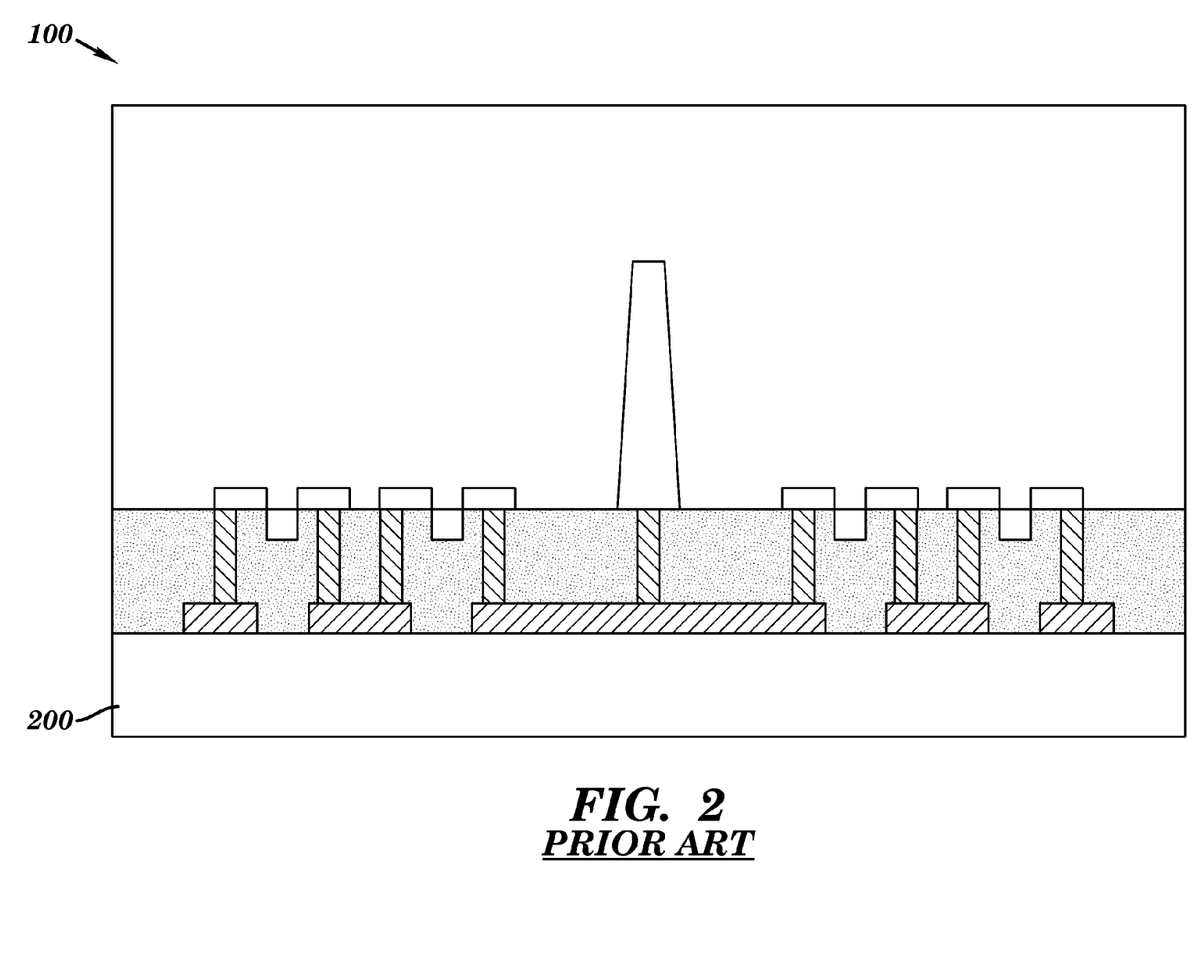

Referring to FIG. 2, optionally the wafer 100 may be bonded to a second handle wafer 200 using standard processes, such as temporary adhesive bonding. Using handle wafer 200 allows wafer 100 to be thinned down, enabling a shorter through silicon via.

Figure 3:
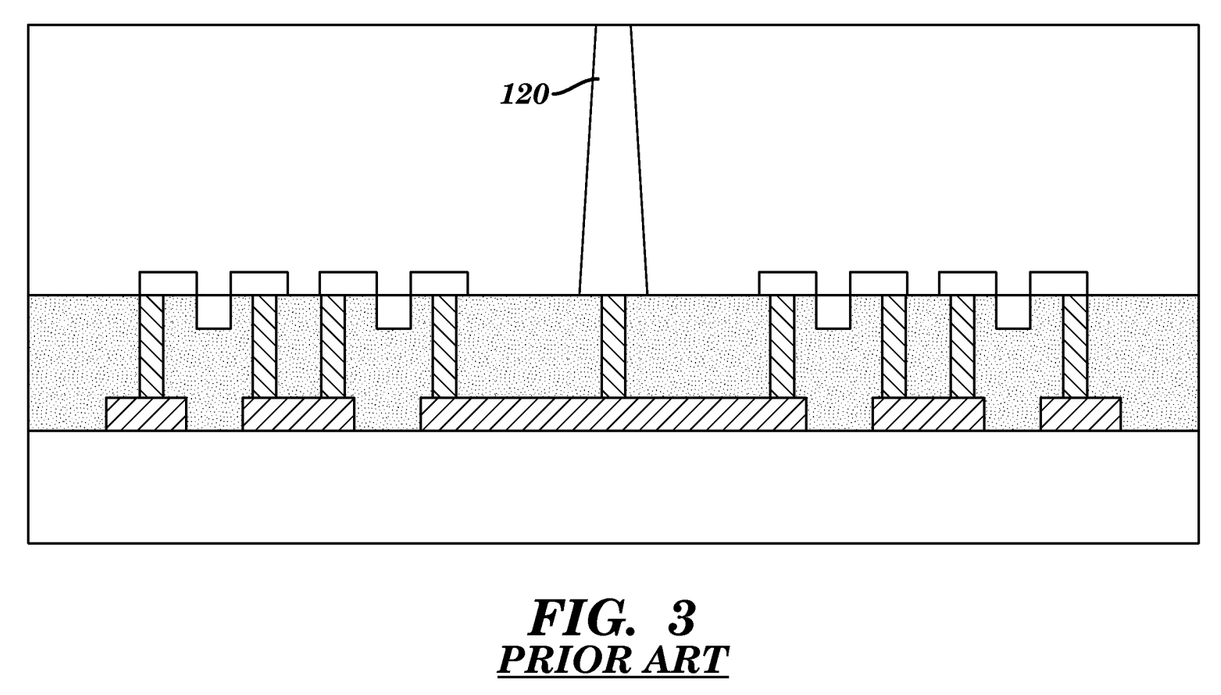

Referring to FIG. 3, silicon is thinned from a back side of wafer 100 to expose the through-silicon-via 120. The silicon is thinned using standard processes such as wafer grinding, chemical-mechanical polish (CMP) or chemical or ion etching and the like.

Figure 4:
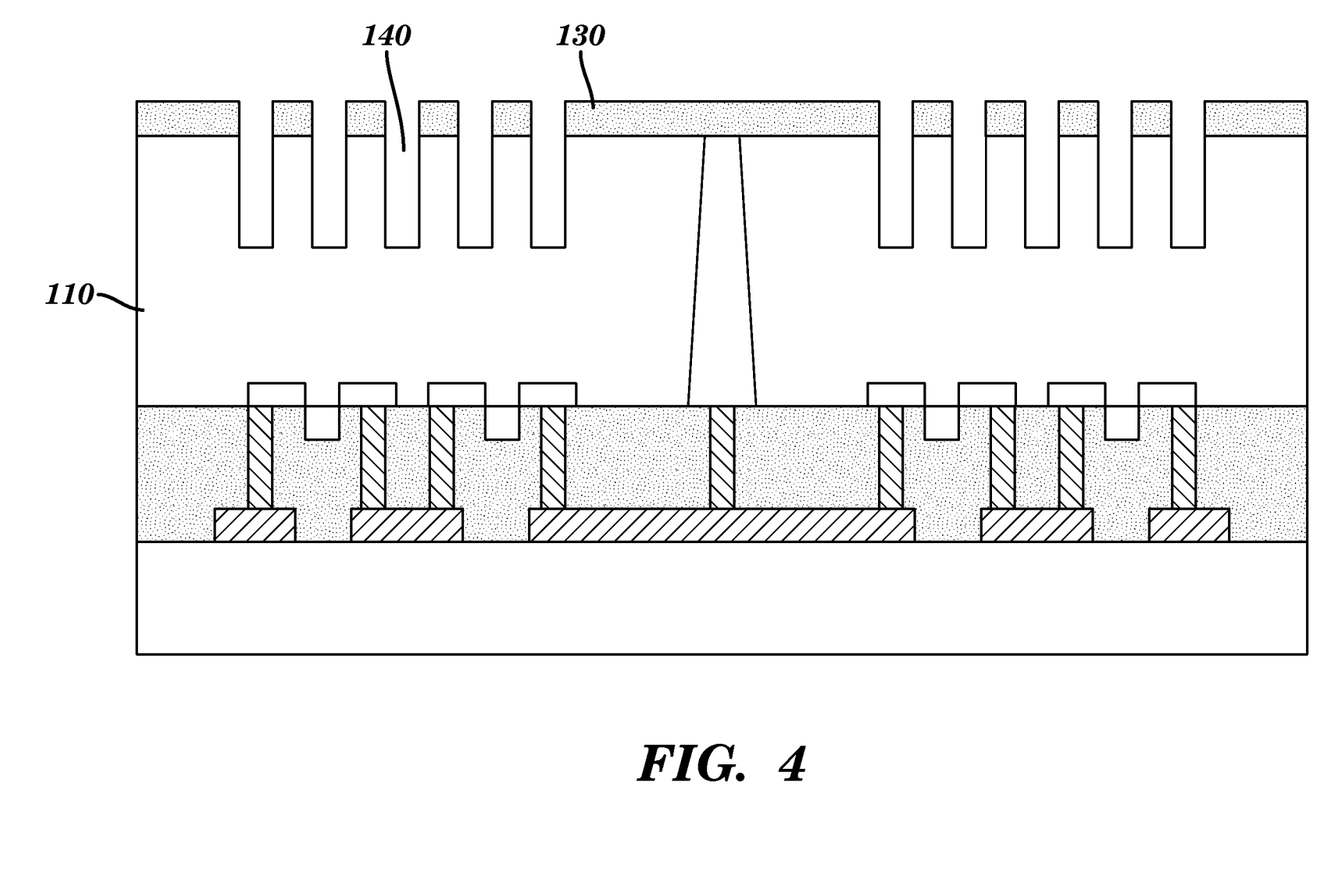
FIGS. 4-6 show processing steps and intermediate structures in accordance with an embodiment of the invention.

Referring to FIG. 4, a pad layer 130 is deposited on top of the substrate 110. Pad layer 130 may be deposited by chemical vapor deposition (CVD), rapid thermal chemical vapor deposition (RTCVD), plasma enhanced chemical vapor deposition (PECVD), atomic layer deposition (ALD) or other methods. Pad layer 130 may be silicon nitride, silicon dioxide, polysilicon or other materials or combination of materials. Deep trenches 140 are formed on the back side of wafer 100. Deep trenches 140 may be formed by using the pad layer as a mask, and using a reactive ion etch (RIE) to form the trenches. The trenches 140 may be 0.05 micrometers to several micrometers in width, with a depth of 100 nm to 10 um, with a typical aspect ratio of 30-60.

Figure 5:
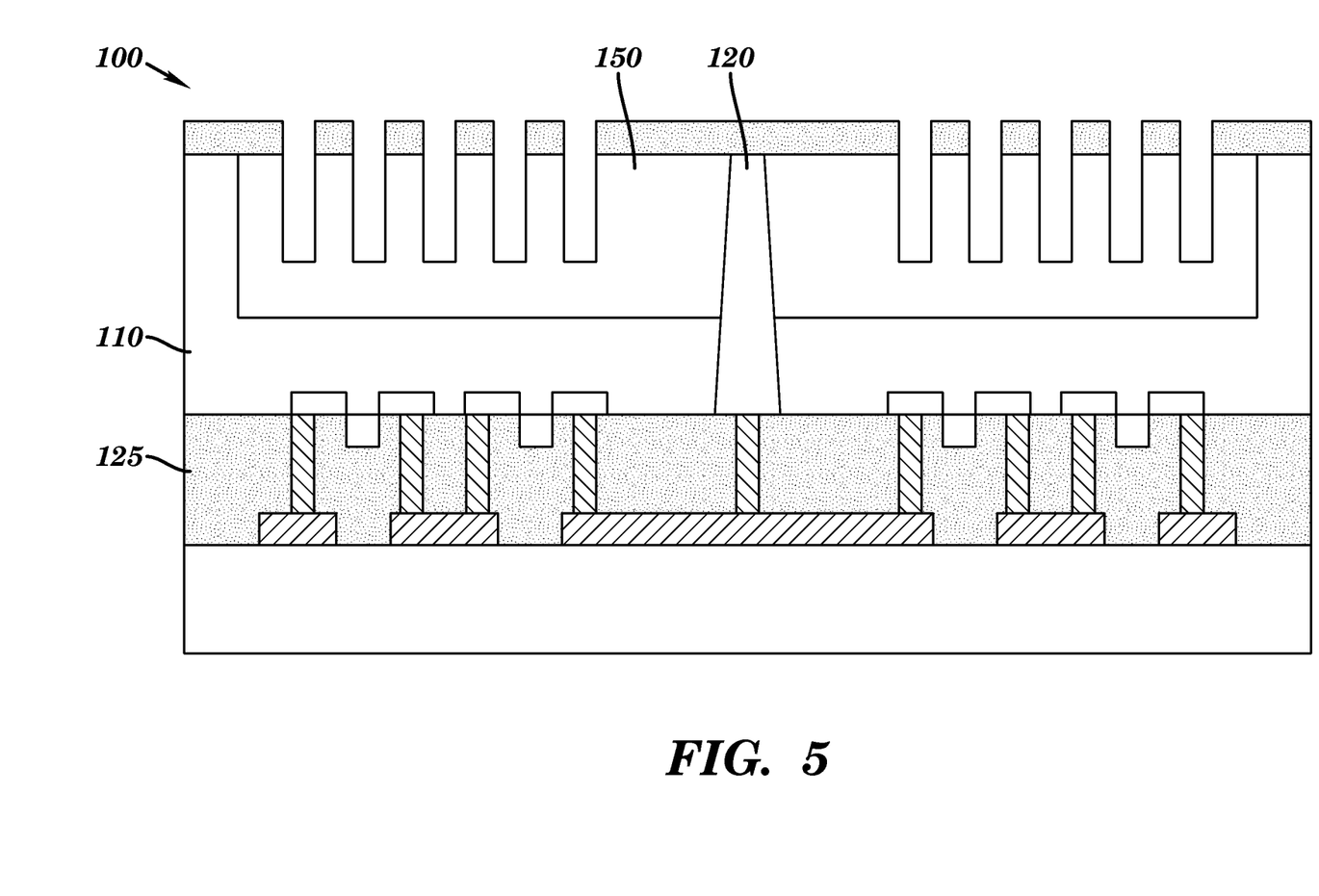

Referring to FIG. 5, a buried plate 150 is formed in substrate 110. Buried plate 150 may be formed by plasma doping, thermal diffusion or ion implantation. Preferably the dose of the dopant is sufficient to provide low sheet resistance, such as 10-200 ohms per square. Buried plate 150 is electrically connected to through-silicon-via 120. Laser annealing or other low thermal budget anneal is performed to activate dopants without distributing devices 125 on a front side of the wafer 100.

Figure 6:
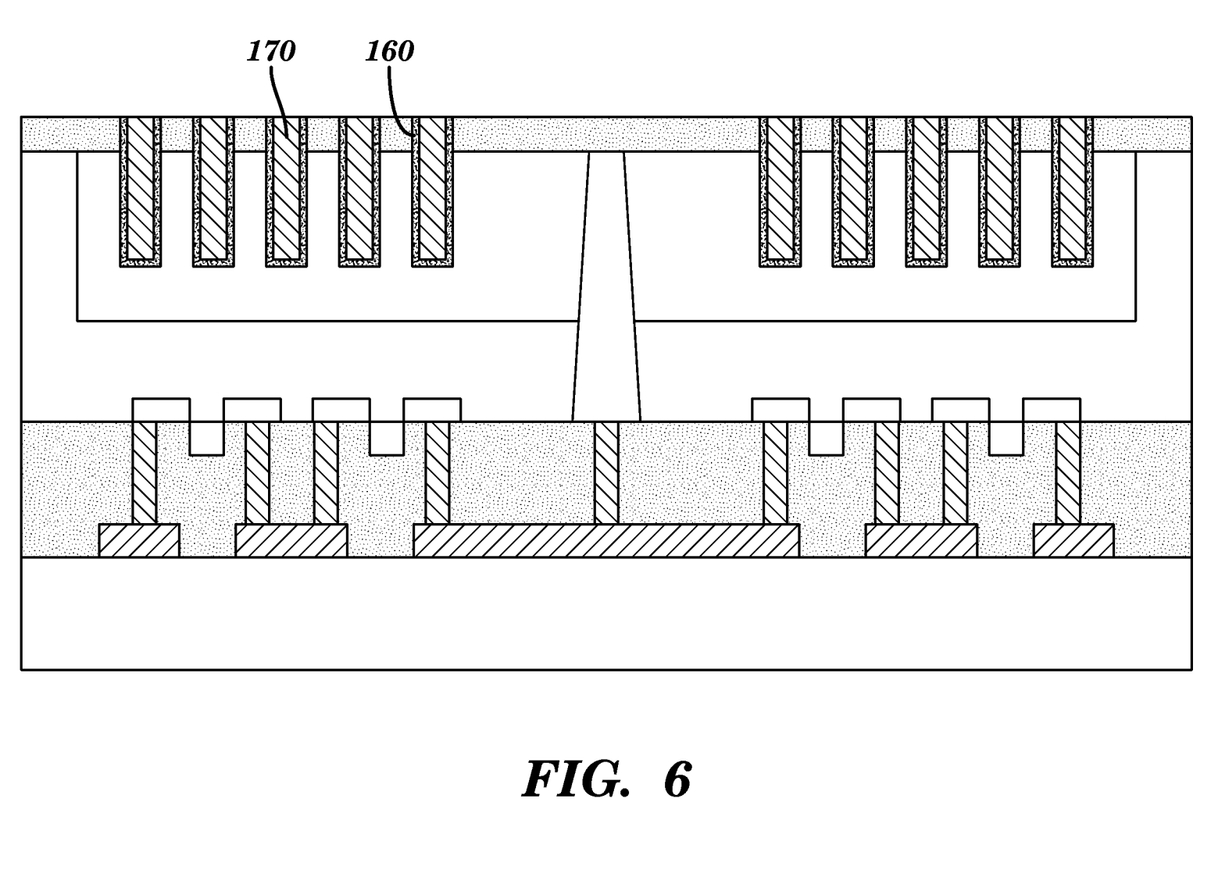

Referring to FIG. 6, a node dielectric layer 160 is deposited in the deep trenches 140. Node dielectric layer 160 may be deposited by thermal oxidation or any combination of known or later developed processes, such as CVD. Node dielectric layer 160 may include, but is not limited to: silicon dioxide, silicon nitride, silicon oxynitride, hafnium oxide or hafnium silicate. Node dielectric layer 160 may be approximately 1 nm to 50 nm thick and preferably about 4 nm thick. The deep trenches 140 are filled with a conductive material 170. Conductive material 170 may include, but is not limited to tungsten (W), copper (Cu) or polysilicon (poly-Si).

Figure 7:
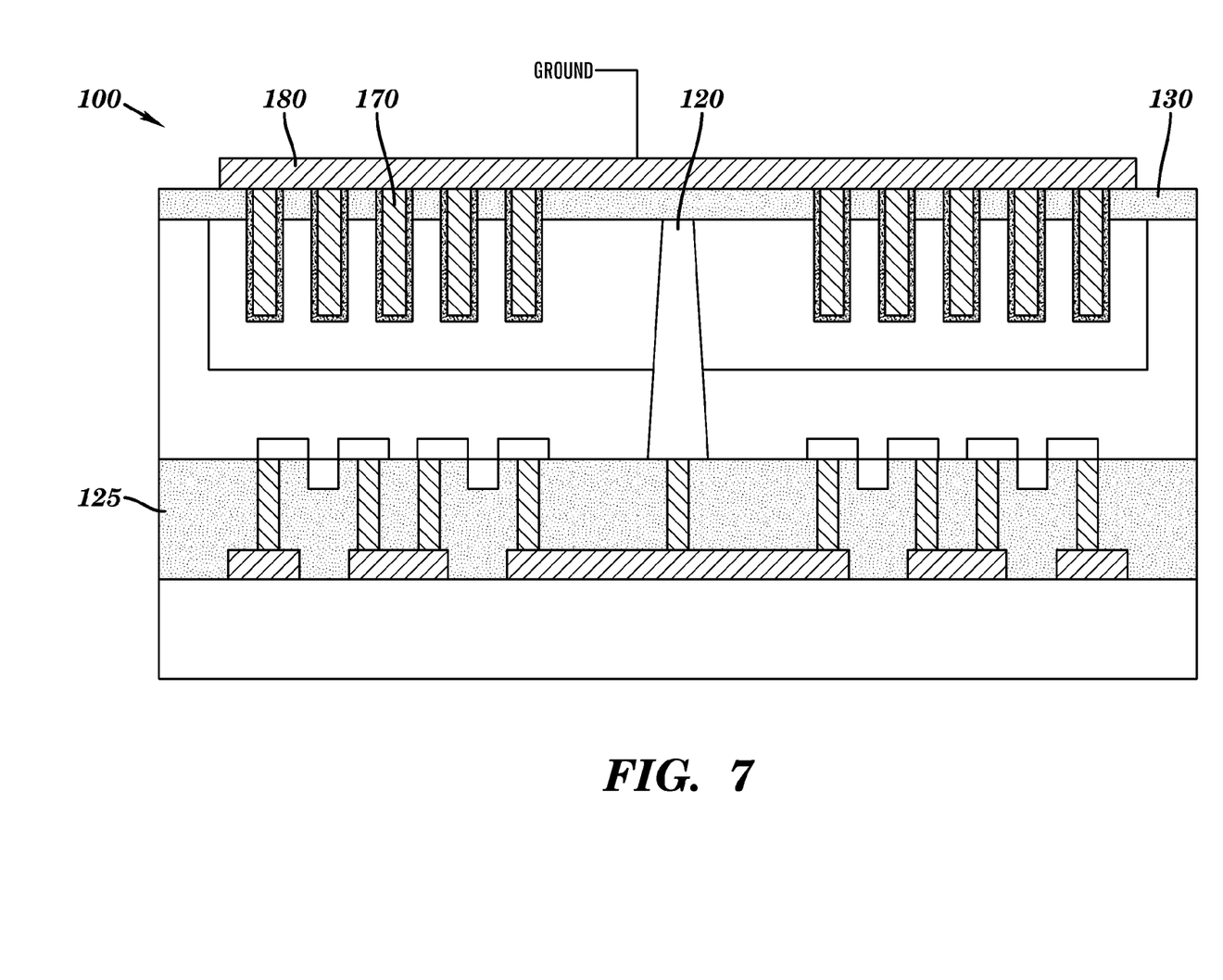
FIG. 7 shows processing steps and a final structure in accordance with an embodiment of the invention.

Referring to FIG. 7, the final structure is shown. A conductive layer 180 is deposited over the pad layer 130 and conductive material 170 and optionally patterned using known methods in the art. Conductive layer 180 may include, but is not limited to poly-Si, Cu, W or other conductor. Optionally, conductive layer 180 and conductive material 170 may be done in the same deposition step. The conductive layer 180 is connected to ground. The other capacitor electrode is electrically connected to the devices 125 on the front side of the wafer 100 by through-silicon-via 120. The deep trench capacitors do not occupy any area on the front side of the wafer 100. The deep trench capacitors may be used for capacitance enhancement. A high-k dielectric may be used without the constraint of thermal budget, since there is optionally no thermal budget after the dopant in the trench is activated.

Figure 8:
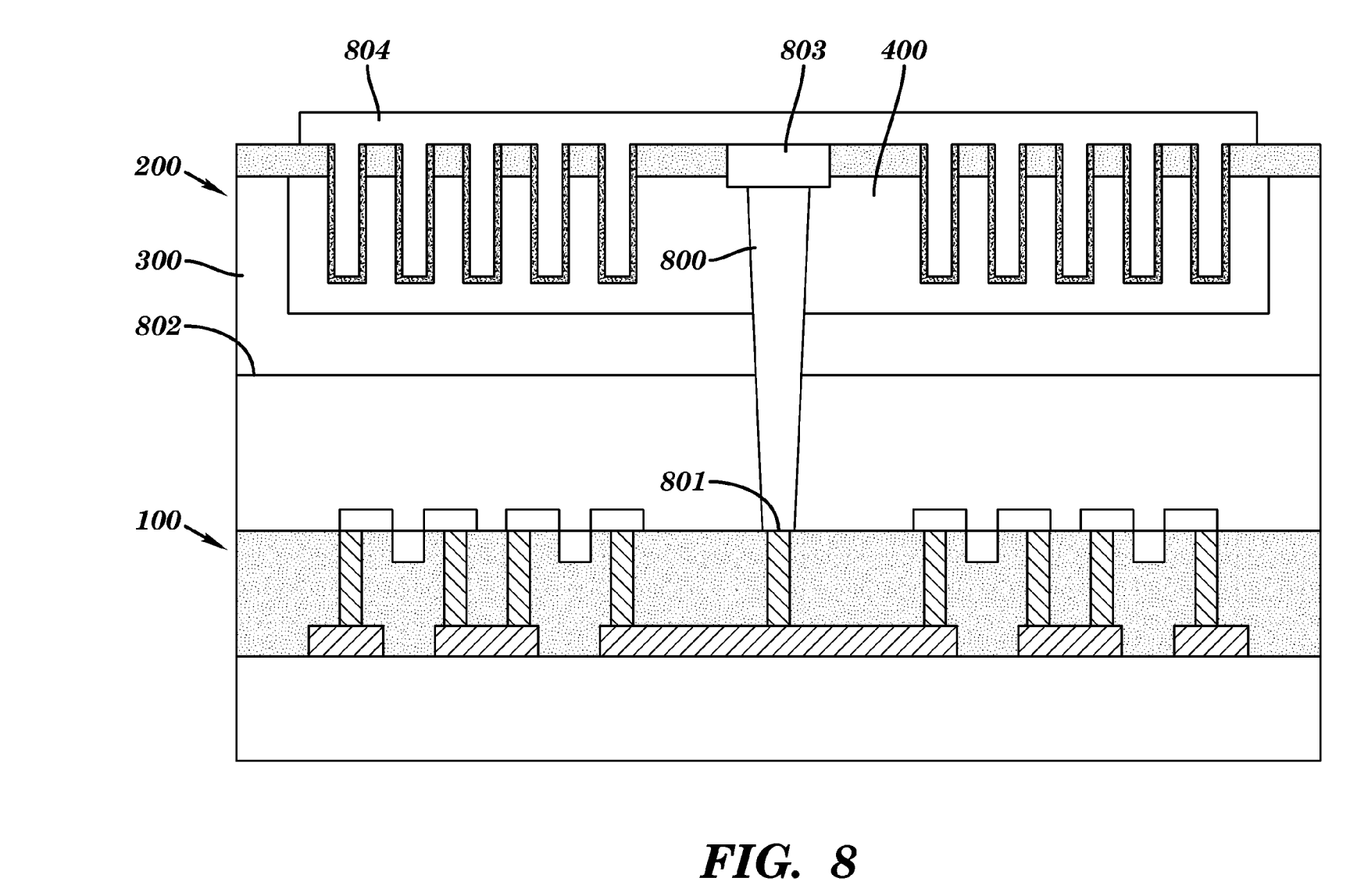
FIG. 8 shows a final structure in accordance with a second embodiment of the invention.

FIG. 8 shows a final structure in accordance with a second embodiment of the invention. Capacitors are placed on a second wafer 200 which is bonded to a first wafer 100. A through-silicon-via contact is formed. Placing the capacitors on the back of the wafer saves valuable FEOL space. If temporary handle wafers were used in fabrication, they are removed leaving the final structure as shown in FIG. 8. First wafer 100 is fabricated using standard processes through the front end of line, the middle of the line and the back end of the line. A through-silicon-via (TSV) 800 contacts wiring 801 on first wafer 100. When wafer fabrication is complete, a handle wafer is bonded to the wiring side of the wafer 100 in accordance with standard practices. The back side of wafer 100 is then thinned down using standard processes such as grinding, polishing, dry and wet etching and the like. The backside surface is then prepared for bonding. The bond may be an adhesive bond, an oxide to oxide bond, a metal to metal bond or some combination of those.

In parallel, a second wafer 200 is bonded to a handle wafer, thinned as described above and a new backside surface is prepared for bonding. These two pairs of wafers are then bonded together by a bond 802. Bond 802 may be an adhesive bond, an oxide to oxide bond, a metal to metal bond, or some combination of those. The handle wafer attached to second wafer 200 is then released. TSV 800 is fabricated from second wafer 200 using standard lithography and metallization processes. TSV 800 is placed to connect to the correct termination on first wafer 100 and to form good electrical contact to a buried plate 400 formed in a substrate 300. After TSV 800 is metalized, the structure is recessed and filled with a nonconductive material 803 to insulate it from the blanket electrical connection which will be formed on the surface of the substrate. Deep trench capacitors 804 are formed on the surface of wafer 200 using standard processes. A blanket conductive layer covers the trenches as described previously.

Figure 9:
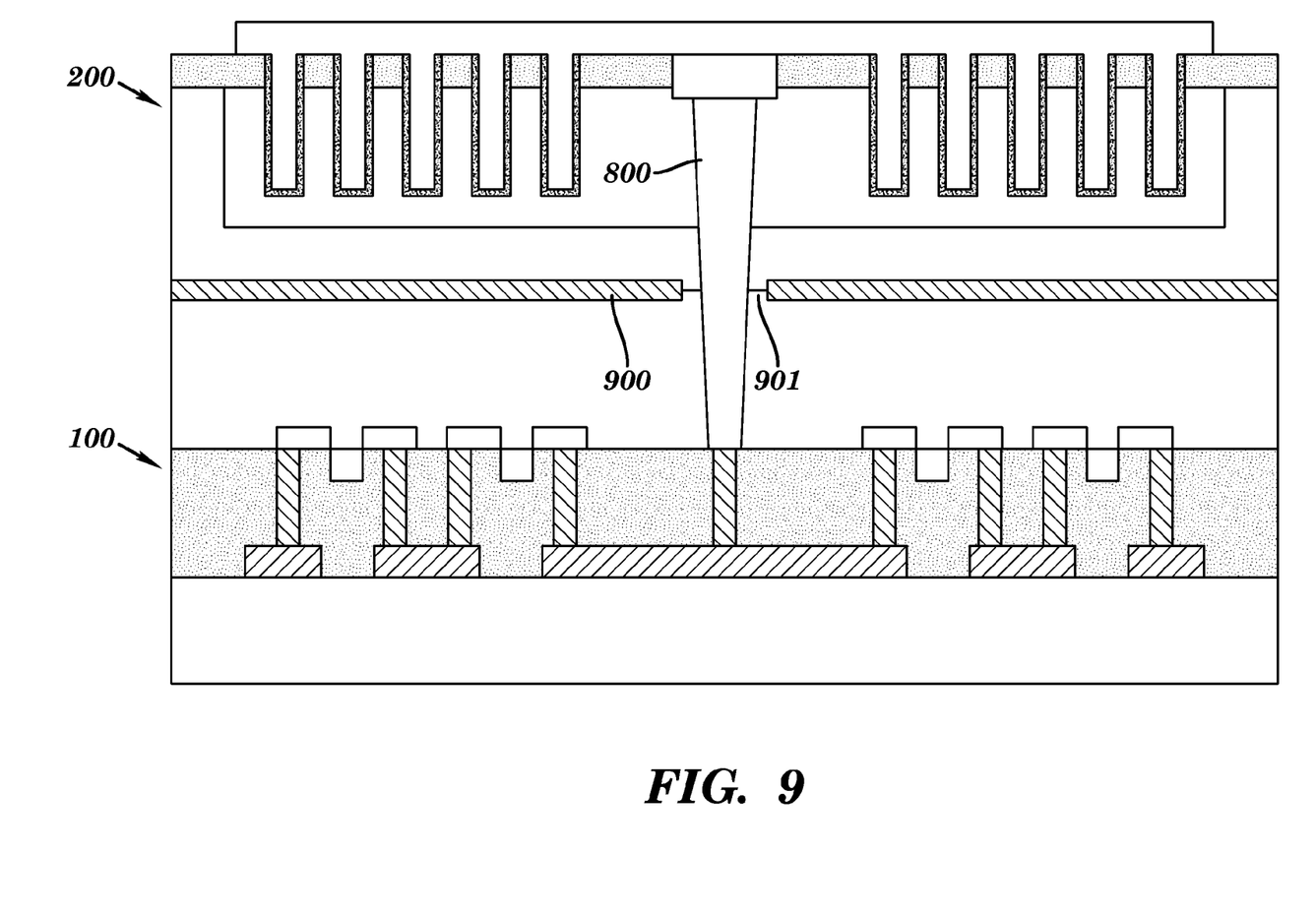
FIG. 9 shows a final structure in accordance with a third embodiment of the invention.

FIG. 9 shows a final structure in accordance with a third embodiment of the invention. If first wafer 100 and second wafer 200 are bonded using a metal to metal bond (such as Cu to Cu), then the bonding metal 900 on each wafer may be patterned to create open keep out areas 901 which have no metal in the areas where TSV 800 will be processed in subsequent steps. The purpose of the keep out areas is to provide electrical isolation between TSV 800 and the bonding metal 900 as well as to simplify processing of TSVs.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a deep trench capacitor comprising:
   providing a first wafer, the first wafer having a front side and a back side and including a substrate;
   forming devices on the front side of the first wafer;
   forming a through-silicon-via within the substrate from the front side of the first wafer;
   thinning the substrate from the back side of the first wafer to expose the through silicon-via;
   depositing a pad layer on the substrate from the back side of the first wafer;
   forming a plurality of deep trenches within the substrate from the back side of the first wafer;
   forming a buried plate within the substrate from the back side of the first wafer, wherein the buried plate contacts the through-silicon-via and comprises dopants;
   performing an anneal to activate the dopants;
   depositing a node dielectric layer in the plurality of deep trenches;
   filling the plurality of deep trenches with a conductive material; and
   depositing a conductive layer over the pad layer and the conductive material from the back side of the first wafer.

2. A method according to claim 1, wherein the first wafer is bonded to a second handle wafer.

3. A method according to claim 1, wherein the pad layer is deposited by chemical vapor deposition (CYD), rapid thermal chemical vapor deposition (RTCYD), plasma enhanced chemical vapor deposition (PECYD) or atomic layer deposition (ALD).

4. A method according to claim 3, wherein the pad layer is selected from the group consisting of: silicon nitride, silicon dioxide and polysilicon.

5. A method according to claim 1, wherein the plurality of deep trenches are formed by using the pad layer as a mask and using a reactive ion etch (RIE) to form the trench.

6. A method according to claim 1, wherein the buried plate is formed by plasma doping, thermal diffusion or ion implantation.

7. A method according to claim 1, wherein the node dielectric layer is deposited by thermal oxidation or chemical vapor deposition (CVD).

8. A method according to claim 7, wherein the node dielectric layer is selected from the group consisting of: silicon dioxide, silicon nitride, silicon oxynitride, hafnium oxide and hafnium silicate.

9. A method according to claim 1 wherein the conductive material is selected from the group consisting of: tungsten (W), copper (Cu) and polysilicon (poly-Si).

10. A method according to claim 1 wherein the conductive layer is selected from the group consisting of: tungsten (W), copper (Cu) and polysilicon (poly-Si).

11. A method of forming a deep trench capacitor, comprising:
    providing a first wafer having a front side and a back side and including a substrate on the back side of the first wafer;
    providing a second wafer having a front side and back side and a substrate;
    bonding the first wafer to the second wafer by bonding the front side of the second wafer to the substrate of the first wafer;
    fabricating a through-silicon-via in the first and second wafers from the back side of the second wafer;
    metalizing the through-silicon-via;
    forming a recess above the through-silicon-via from the back side of the second wafer;
    filling the recess with a non-conductive material from the back side of the second wafer;
    forming a plurality of deep trenches in the substrate of the second wafer from the back side of the second wafer;
    forming a buried plate in the substrate of the second wafer from the back side of the second wafer, wherein the through-silicon-via contacts the buried plate, extends through the substrate of the first wafer, and contacts wiring on the back side of the first wafer; and
    filling the plurality of deep trenches with a conductive material from the back side of the second wafer.

12. A method according to claim 11, wherein the first wafer is bonded to the second wafer by an adhesive bond, an oxide to oxide bond or a metal to metal bond.

13. A method according to claim 11, wherein the first wafer is bonded to the second wafer by a metal to metal bond and a bonding metal on the first and second wafers is patterned to create a keep out area.

* * * * *